United States Patent [19]

Shimizu et al.

[11] Patent Number: 5,061,550
[45] Date of Patent: Oct. 29, 1991

[54] MULTILAYER MATERIAL HAVING A RESISTANCE LAYER FORMED ON AN ELECTRICALLY CONDUCTIVE LAYER AND A MULTILAYER BOARD FOR A PRINTED CIRCUIT BOARD WHICH HAS A RESISTANCE LAYER

[75] Inventors: Kazunao Shimizu; Masahiro Mikamo; Takeshi Yamagishi, all of Shimodate, Japan

[73] Assignee: Nippon Denkai, Co. Ltd., Tokyo, Japan

[21] Appl. No.: 466,983

[22] Filed: Jan. 18, 1990

[30] Foreign Application Priority Data

Oct. 2, 1989 [JP] Japan ................................. 1-255134

[51] Int. Cl.$^5$ ............................................. B32B 9/00
[52] U.S. Cl. ................................. 428/209; 428/409; 428/446; 428/457; 428/901; 427/96
[58] Field of Search ............... 428/901, 409, 446, 457, 428/209; 427/96

[56] References Cited

U.S. PATENT DOCUMENTS 4,082,591 4/1978 Morisaki et al. ................... 156/150

FOREIGN PATENT DOCUMENTS 0118394 9/1981 Japan .................................. 428/209
2073778 10/1981 United Kingdom ............... 428/901

Primary Examiner—Patrick J. Ryan
Assistant Examiner—Elizabeth Evans
Attorney, Agent, or Firm—Antonelli, Terry, Stout & Kraus

[57] ABSTRACT

An article of manufacture in form of a multilayer material includes (a) a conductive layer made of an electrically highly conductive material,
(b) a resistance layer formed on the conductive layer, the resistance layer being made of an electrical resistance material,
(c) a chromate treatment layer formed on the resistance layer, the chromate treatment layer being formed on the resistance layer by subjecting the surface of the resistance layer to a chromate treatment and containing chromium in an amount of 5 to 120 $\mu$g per 1 dm$^2$ of the chromate treatment layer and,
(d) a silane coupling agent layer formed on the chromate treatment layer, the silane coupling agent layer being formed by applying a solution of a silane coupling agent to the surface of the chromate layer followed by drying. The concentration of the silane coupling agent in the solution is 0.001 to 5% by weight.

A multilayer board having a resistance layer for the manufacture of printed circuit boards is produced by laminating the multilayer material and an insulating support.

10 Claims, No Drawings

MULTILAYER MATERIAL HAVING A RESISTANCE LAYER FORMED ON AN ELECTRICALLY CONDUCTIVE LAYER AND A MULTILAYER BOARD FOR A PRINTED CIRCUIT BOARD WHICH HAS A RESISTANCE LAYER

BACKGROUND OF THE INVENTION (a) Industrial Field of the Invention

The present invention relates to a multilayer material having a resistance layer formed on an electrically conductive layer, the multilayer material being used for the production of printed circuit boards, and to a multilayer board having a resistance layer, where the multilayer board is produced by using the multilayer material and is used for the production of printed circuit boards.

More specifically, the present invention relates to a multilayer material having a resistance layer formed on an electrically conductive layer, which can be laminated to an electrically insulating support so firmly as to improve greatly the peel strength between the resistance layer of the multilayer material and the insulating support, and to a multilayer board which has a resistance layer and is used for the production of printed circuit boards. The multilayer board is produced by laminating the multilayer material having a resistance layer with an insulating support and exhibits outstanding peel strength between the resistance layer and the insulating support.

(b) Description of the Related Art

In production of a printed circuit board, resistors have been installed generally by soldering resistor components onto a printed wiring board. This method, however, not only requires troublesome operations, but also can be no longer sufficiently adaptable to the recent trend in this field of making printed circuit boards smaller, lighter, and denser or more compact. Thus, the method of soldering resistance components has been replaced by an improved method wherein a printed wiring board having a printed resistor circuit is produced from a copper-clad laminate having a resistance layer, where the copper clad laminate is produced by laminating a copper foil provided with a resistance layer onto an electrically insulating support base, for example, an epoxy resin impregnated glass base, by thermo-compression, with the resistance layer interposed between the copper foil and the insulating support. In this method, an intended printed wiring circuit containing printed resistor components is formed on the electrically insulating support, in the same way as in the formation of the wiring patterns of general printed wiring boards, by patterning the copper foil and the resistance layer employing a subtractive process and a selective etching technique. In forming the printed wiring circuit containing printed resistor components, the copper foil layer and the resistance layer are etched respectively to remove their respective unwanted portions, by using at least two etchants and repeating formation of a resist coating, etching, and removal of the resist coating. Accordingly, in this method, the interface between the resistance layer and the electrically insulating support is apt to be eroded from the sides of the laminate by the erosive action of the acidic or alkaline environment brought by the etchants and the resist removing liquids used, thereby resulting in a decrease in the peel strength (chemical resistance) between the resistance layer and the insulating support. It is, therefore, important for improving reliability of the boards having resistance layers for printed circuit boards to increase the peel strength between the resistance layer and the electrically insulating support including the peel strength under the normal condition and after heat treatment.

There have been some attempts to improve the peel strength between the resistance layer and the insulating support. For example, disclosed in Japanese Patent Application Kokoku Koho (Publication) No. 57-3234 is a method of increasing the peel strength between a resistance layer and an insulating support by using as a material of the resistance layer a resistive material which comprises an electrically plated nickel-phosphorus composition having a content of phosphorus of not more than about 30% by weight and having a content of oxide, hydroxide and/or peroxide of nickel of not less than 50% by weight based on the total of the nickel components.

In addition, disclosed in Japanese Patent Application Kokoku Koho (Publication) No. 55-32001 is a method of increasing the peel strength by using a conductive plate one of the both surfaces of which is roughened by a surface roughening treatment, forming a plated resistive layer on the roughened surface of the conductive plate, and then bonding an insulating support to the surface of the plated resistive layer.

Neither the former method nor the latter method is, however, a method of improving the peel strength by bonding the resistance layer (namely, a metallic or metal-like substance) chemically with the insulating support (namely, an organic substance such as the above-described glass-epoxy resin support). Especially, in the latter method, an increase in mechanical peel strength is attempted by roughening the surface of the conductive plate in anticipation of increasing the surface area of the resistive plated layer adhering to the insulating support. However, the method is encountered with a problem that in case a thick resistive plated layer is formed, the surface area of the plated resistive layer is practically reduced because the roughened surface of the conductive plate is leveled by the thick resistive layer plated thereon, and improvement of the peel strength becomes difficult.

As mentioned above, the conventional methods have failed to provide a multilayer board for the manufacture of printed circuit boards which has a resistance layer therein and has a high peel strength so as to be sufficiently reliable in practical use.

SUMMARY OF THE INVENTION

An object of the present invention is to provide a multilayer material having a resistance layer formed on an electrically conductive layer which, when it is laminated by thermo-compression with an insulating support, enables the resistance layer and the insulating support to adhere to each other so strongly as to satisfy the practical requirements.

Another object of the present invention is to provide a multilayer board for the manufacture of a printed circuit board which has therein a resistance layer adhering to the insulating support thereof so strongly that even if the resistance layer and the electrically conductive layer thereon are patterned into a fine line circuit, the circuit layer will not peel off from the insulating support.

As the result of our researches to achieve the above-described objects, we have found that a strong peel strength between an insulating support and a resistance layer formed on an electrically conductive layer can be obtained by providing on the surface of the resistance layer a chromate treatment layer containing a specific amount of chrome and, thereon, a silane coupling agent layer formed by a specific procedure, and laminating the resistance layer with the insulating support through the chromate treatment layer and the silane coupling agent layer. On the basis of this finding, we have completed the present invention.

Accordingly, the present invention provides an article of manufacture in form of a multilayer material which comprises (a) a conductive layer consisting of an electrically highly conductive material, (b) a resistance layer formed on the conductive layer, the resistance layer consisting of an electrical resistance material, (c) a chromate treatment layer formed on the resistance layer, the chromate treatment layer being formed on the resistance layer by subjecting the surface of the resistance layer to a chromate treatment and containing chromium in an amount of 5 to 120 $\mu g$ per 1 $dm^2$ of the chromate treatment layer, (d) a silane coupling agent layer formed on the chromate treatment layer, the silane coupling agent layer being formed by applying a solution of a silane coupling agent to the surface of the chromate treatment layer and drying, and the concentration of the silane coupling agent in the solution to be applied being 0.001 to 5% by weight.

Moreover, the present invention also provides a multilayer board having a resistance layer which is used for the manufacture of a printed circuit board and comprises the above-described multilayer material and an electrically insulating support adhering to the silane coupling agent layer of the multilayer material.

DESCRIPTION OF THE PREFERRED EMBODIMENTS

The preferred example of the conductive layer consisting of a highly conductive material to be used in the present invention is a metal foil, such as a copper foil including an electrolytic copper foil and a rolled copper foil. Other examples of the conductive layer which also can be used in the present invention include other metal foils, such as an aluminum foil, a zinc foil and a tin foil; alloy foils containing, for example, aluminum, zinc or tin; and composite foils, such as an aluminum foil on which a plated metal layer (e.g., a plated copper layer or a plated zinc layer) having a thickness of about several $\mu m$ is formed.

The thickness of these foils is not specifically limited. However, from an economical or operational point of view, the preferred are those having a thickness of 5 to 100 $\mu m$.

Some examples of the resistance layer formed on the conductive layer include electrically resistive binary or ternary alloys containing, for example, Ni, Cr, Co or Fe. The methods of forming the resistance layer on the conductive layer which can be used in the present invention include electroplating method, electroless plating method, chemical plating method, vapor deposition method, and spattering method, although they are not specifically limited. A suitable thickness of the resistance layer is determined in the light of the intended resistance values of resistors to be formed and the specific resistance of the material of the resistance layer. In usual cases, it can be in the range of 100 Å to 5,000 Å.

Some examples of the resistive materials that can be used as the resistive material in the resistance layer in the present invention include those described in U.S. Pat. No. 2,662,957, those described in U.S. Pat. No. 3,857,683, and those described in Japanese Patent Application Kokai Koho (Laid-open) No. 57-3234. Some typical examples of the resistive material include Ni-P, Ni-Co, Ni-Co-P, Ni-Fe, Ni-Cr, Ni-Cr-P, Ni-Sb, Ni-B, Ni-Mo, Cr-Ni-Fe, Cr-Sb, Cr-P, Co-B, Co-W, Co-W-P, Co-V, and Co-Ni-Cr.

Among the layers of those materials, a layer of a plated Ni-P alloy, Ni-Cr alloy can be preferably used as the resistance layer.

On the resistance layer formed is a chromate treatment layer, which is formed by subjecting the surface of the resistance layer to a chromate treatment, and the content of chromium in the chromate treatment layer ranges from 5 to 120 $\mu g/dm^2$. Under the chemically bonding action between the chromate treatment layer and the silane coupling agent layer formed thereon, the chromate treatment layer gives the effect of improving the peel strength between the resistance layer and an insulating support to be laminated with the resistance layer through the chromate treatment layer and the silane coupling agent layer.

The chromate treatment layer may be formed by subjecting the surface of the resistance layer to a chromate treatment with an aqueous solution of one or more compounds selected from water-soluble chromium compounds, such as chromic anhydride, dichromates, and chromates, which have or can give hexavalent chromium ion by using, for example, impregnation technique or electrolysis technique. Examples of the composition of the solution and the conditions which can be suitably employed in forming the chromate treatment layer are described below. The conditions described in the parentheses are especially preferable conditions.

The composition of the solution: $Na_2Cr_2O_7.2H_2O$, $CrO_3$ or $K_2CrO_4$: 0.5-20 g/l (3-10 g/l).

pH of the solution: 1-13 (acidic). Where, adjustment of the pH can be achieved by the addition of an acid or an alkali.

Bath temperature: 10°-80° C. (20°-40° C.).

Treating period: 1-60 sec (1-10 sec).

Electric current density: 0.1-10 $A/dm^2$ (0.3-5 $A/dm^2$).

Anode: Pb or a Pb alloy; Pt or Pt oxide; Ir or Ir oxide.

The chromate treatment layer should be formed so that the chromate treatment layer has a chromium content of 5 to 120 $\mu g/dm^2$ as measured as chromium metal. If the chromium content is less than 5 $\mu g/dm^2$, only a small improvement of the peel strength between the resistance layer and an insulating support can be attained. On the other hand, if it is in excess of 120 $\mu g/dm^2$, the peel strength tends to decrease and the effect on the improvement becomes smaller. The especially preferable range of the chromium content is from 10 to 100 $\mu g/dm^2$. The preferred range of the thickness of the chromate treatment layer is from 40 to 400 Å.

The silane coupling agent layer is formed on the chromate treatment layer by applying a solution of a silane coupling agent having a concentration of the agent of 0.001 to 5% by weight, followed by drying.

Some examples of the silane coupling agent to be used are those represented by the following general formula:

$$YRSiX_3$$

wherein,

Y is a functional group which has a reactivity toward a polymer,

R is a combining group linking the group Y with the silane atom and containing an acyclic or cyclic hydrocarbon group, and X is an organic or inorganic hydrolyzable group bound to the silane atom.

Typical examples of the agents represented by the general formula include
vinyltrimethoxysilane,
vinyltriethoxysilane,
vinyltris(2-methoxyethoxy)silane,
N-(2-aminoethyl)-3-aminopropylmethyldimethoxysilane,
N-(2-aminoethyl)-3-aminopropyltrimethoxysilane,
3-aminopropyltriethoxysilane,
3-glycidoxypropyltrimethoxysilane,
3-glycidoxypropylmethyldimethoxysilane,
2-(3,4-epoxycyclohexyl)ethyltrimethoxysilane,
3-chloropropylmethyldimethoxysilane,
3-chloropropyltrimethoxysilane,
3-methacryloxypropyltrimethoxysilane, and
3-mercaptopropyltrimethoxysilane.

One or more kinds of these silane coupling agents are dissolved in a solvent, such as water or a mixture of water and alcohol, to prepare the solution to be applied to the chromate treatment layer to form the silane coupling agent layer, wherein the concentration of the total of the silane coupling agents in the solution to be applied should be in the range of 0.001 to 5% by weight.

If the concentration of the solution of a silane coupling agent is out of the above described range, the intended improvement in peel strength will not be obtained, and consequently, the objects of the present invention cannot be sufficiently attained. The especially preferred range of the concentration of the silane coupling agent in the solution to be applied is from 0.1 to 3% by weight. The temperature of the solution to be applied may be room temperature, although it is not always limited to room temperature. Application of the solution to the chromate treatment layer may be achieved by, for example, dipping, spraying, or brush-coating. After application, the coating layer is dried usually at a temperature ranging from room temperature to 100° C. to form the intended silane coupling agent layer on the chromate treatment layer.

The multilayer board having a resistance layer for the manufacture of a printed circuit board can be prepared by laminating the multilayer material described above and an insulating support so that the silane coupling agent layer adheres to the insulating support.

Some examples of the insulating support to be used in the present invention include thermoplastic materials and those prepared by impregnating a base material with a thermosetting resin to produce a resin impregnated base material, followed by setting the impregnated resin by heating.

The thermosetting resin to be used may be those which have conventionally been used for the preparation of copper clad laminates, including epoxy resins, phenol resins, polyimide resins, modified polyimide resins, and unsaturated polyester resins. Some examples of the base material which can be used include glass cloth, aramid-fiber cloth, and paper. Formation of the insulating support from such resin impregnated base material is usually achieved in the lamination step in which the resin impregnated base material and the multilayer material having a resistance layer are laminated, and simultaneously, the impregnated resin in the base material is thermoset, to form the inventive multilayer board having a resistance layer. The lamination is usually achieved by thermo-compression.

Among those insulating supports, preferably used is an insulating support formed from an epoxy resin impregnated glass cloth by thermosetting it in the laminating step.

Some examples of the thermoplastic materials which can be used include polyethylenes, polytetrafluoroethylenes, polyethersulfones, polyetherimides, nylon, polycarbonates, and polypropylene.

It is also possible to bond the multilayer material of the present invention to the insulating support after an adhesive was applied to the surface of the multilayer material.

Thus obtained multilayer board for printed circuit boards has a resistance layer which is laminated with an insulating support through the chromate treatment layer and the silane coupling agent layer with an extremely high peel strength. Therefore, highly reliable printed circuit boards containing required resistors can be obtained by processing the multilayer board of the present invention to make a circuit.

As described above, the multilayer material of the present invention comprises an electrically highly conductive layer, a resistance layer, a chromate treatment layer, and a silane coupling agent layer. The reason why the peel strength between the resistance layer and an insulating support is improved when the inventive multilayer material and the insulating support are laminated together by thermo-compression may be described by the following conceivable mechanism. That is to say, the resistance layer and the chromate treatment layer adhere strongly to each other, and it can be supposed that the chromate treatment layer formed on the resistance layer contains hydrated chromium oxide (Hereinafter, it is simply referred to as M-OH.) on its surface. On the other hand, the silane coupling agents represented by the above-described general formula are used as an aqueous solution at the time of application, and therefore, their hydrolyzable groups, X (e.g., chloro group, methoxy group, or methoxyethoxy group), are hydrolyzed by the water in the solution to produce silanols according to the following reaction formula:

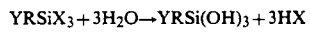

$$YRSiX_3 + 3H_2O \rightarrow YRSi(OH)_3 + 3HX$$

In addition, when the multilayer material of the present invention and an insulating support (e.g., a resin containing base material or an adhesive. Hereinafter, these are simply designated as "P".) are laminated by thermo-compression together through the silane coupling agent layer formed on the chromate treatment layer, the group Y in the above-described general formula, (e.g., vinyl group, amino group, diamino group, chloro group, epoxy group, mercapto group, methacryloxy group, and glycidoxy group) is considered to be chemically bound to the polymer (e.g., a phenol resin, an epoxy resin, an acrylic resin, an alkyd resin, a polyvinyl chloride resin, an unsaturated polyester resin, or a polyurethane resin) contained in "P" according to the reaction as shown below, which provides a very high peel strength between the insulating support and the silane coupling agent layer formed on the chromate treatment layer. While, some of the silanols are supposed to be chemically bound to some of the M-OH in the chromate treatment layer according to the following reaction, which makes the peel strength between the chromate treatment layer and the silane coupling agent layer very high.

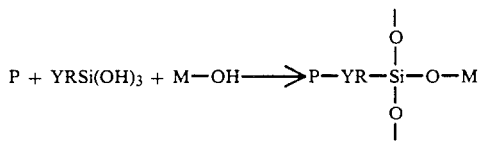

Thus, it can be considered that the silane coupling agent layer located between the chromate treatment layer and the insulating support takes an important role in the improvement of the peel strength between them, bonding them chemically and strongly.

The multilayer material of the present invention, which comprises an electrically conductive layer, a resistance layer, a chromate treatment layer having a specific chromium content, a silane coupling agent layer formed on the chromate treatment layer by using a solution of a silane coupling agent having a specific concentration thereof, has an extremely high peel strength toward an insulating support, when it is bonded to the insulating support. Therefore, the multilayer board of the present invention prepared by bonding the inventive multilayer material to an insulating support has an extremely high peel strength that can be maintained even after it is subjected to chemical or heat treatments.

Accordingly, the multilayer board of the present invention can be suitably used for the manufacture of a printed circuit board having resistor layer therein and having a sufficiently high reliability for practical use.

The invention will be described in more detail with reference to the following examples. These examples, however, are intended to illustrate the invention and are not to be construed to limit the scope of the invention.

EXAMPLES 1 TO 4 AND COMPARATIVE EXAMPLES 1 TO 4

Example 1

An electrolytic copper foil having a thickness of 35 μm the surface of which had been previously roughened by a surface treatment was rinsed with 6N HCl (The temperature of the solution was 25° C.) for 5 min and with water. Onto the washed surface of the copper foil, formed was a resistance layer having an average thickness of about 0.04 μm and comprising a plated Ni-P alloy by an electroplating method by using an electroplating solution having the following compositions under the following plating conditions.

The composition of the solution used:

| | |
|---|---|
| $NiSO_2.6H_2O$ | 37 g/l |
| $NiCl_2.6H_2O$ | 11 g/l |
| $NiCO_3$ | 7 g/l |
| $H_3PO_4$ | 12 g/l |
| $H_3PO_3$ | 7 g/l |

Plating conditions:

| | |
|---|---|
| pH of the solution | 1.8 |
| Electric current density | 1.08 A/dm² |
| Period of the electrolysis | 40 sec |
| Bath temperature of the solution | 76° C. |

The Ni and P contents in the formed resistance layer were 3.98 mg/dm² and 0.70 mg/dm², respectively.

After the plated article was adequately rinsed with water, onto the surface of the resistance layer formed was a chromate treatment layer by an electroplating technique by using an electroplating solution having the following composition under the following plating conditions.

The composition of the solution:

| | |
|---|---|
| $Na_2Cr_2O_7.2H_2O$ | 3.5 g/l |

Plating conditions:

| | |
|---|---|
| pH of the solution | 5.7 |
| Electric current density | 0.5 A/dm² |
| Period of the electrolysis | 4 sec |
| Bath temperature of the solution | 25° C. |

The chromium content in the formed chromate treatment layer is shown in Table 1.

After the prepared article was rinsed adequately with water, onto the surface of the chromate treatment layer formed was a silane coupling agent layer by applying an aqueous solution of 3-glycidoxypropyltrimethoxysilane (0.2 wt %, 25° C.) by dipping the article in the solution for 15 sec, followed by drying at 80° C. for 5 min to obtain a multilayer material having a resistance layer adhering to a conductive layer.

Next, the prepared multilayer material was bonded to an insulating support material (a base material consisting of an epoxy resin impregnated glass cloth) by thermo-compression under the following conditions: i.e., at a temperature of 168° C., at a pressure for the compression of 100 kg/cm², and with a period of the thermo-compression of 60 min; and thus obtained was a copper clad laminate having a resistance layer and having a thickness of about 1.2 mm, which is one example of the multilayer board of the present invention.

In order to evaluate the adhesion property of the above obtained multilayer material or the peel strength of the copper clad laminate obtained, several test pieces were made from the laminate. The evaluation tests of the peel strength were performed to the test pieces some of which were chemically or thermally treated before the respective evaluation tests as shown below. The width of the test pieces for measuring the peel strength was 1 mm in each case.

(1) The peel strength under the normal condition

This peel strength of each test piece was measured at room temperature without any further treatment.

(2) The peel strength of the hydrochloric acid treated test piece

This peel strength of each test piece was measured after the test piece was dipped in 6N HCl for one hour at room temperature.

(3) The peel strength of the potassium cyanide treated test piece

This peel strength of each test piece was measured after the test piece was dipped in 10% KCN solution at 70° C. for 30 min.

(4) The peel strength of the heat-treated test piece

This peel strength of each test piece was measured after the test piece was allowed to stand at 180° C. for 48 hours in a thermostatic chamber.

The resulting values of the peel strength of the respective test pieces are shown in Table 1.

On the basis of the obtained values, the chemical resistance property of the multilayer board (the copper clad laminate) was then evaluated. The chemical resistance property was represented by the chemical degradation rates of the test piece caused by the respective chemical treatments defined by $[(A-B)/A] \times 100$ (%), where A is the value of the peel strength (1) and B is that of the peel strength (2) or (3). The chemical degradation rates thus calculated are shown in the respective parentheses in Table 1.

Examples 2 to 4

Multilayer materials each of which had a resistance layer formed on a conductive layer were prepared by repeating the procedure of Example 1, except that the electroplating solution and conditions for the formation of a chromate treatment layer were varied so as to vary the chromium content of the chromate treatment layers, and the silane coupling agent and the concentration of its solution for the formation of a silane coupling agent layer were varied.

Multilayer boards and the corresponding test pieces therefrom were prepared from the respective multilayer materials by repeating the procedure as described in Example 1.

The evaluations of the peel strength as well as the chemical resistance property of the resulting multilayer boards were performed by repeating the evaluation procedures as described in Example 1.

COMPARATIVE EXAMPLE 1

A multilayer board was prepared by repeating the procedure of Example 1, except that neither chromate treatment layer nor silane coupling agent layer was formed.

The evaluations of the peel strength as well as the chemical resistance property of the resulting board were performed by the evaluation procedures as described in Example 1. The results are shown in Table 1.

COMPARATIVE EXAMPLE 2

A multilayer board was prepared by repeating the procedure of Example 1, except that no silane coupling agent layer was formed.

The evaluations of the peel strength as well as the chemical resistance property of the resulting multilayer board were performed by the evaluation procedures as described in Example 1. The results were shown in Table 1.

COMPARATIVE EXAMPLE 3

A multilayer board was prepared by repeating the procedure of Example 1, except that no chromate treatment layer was formed.

The evaluations of the peel strength as well as the chemical resistance property of the resulting multilayer board were performed by the evaluation procedures as described in Example 1.

COMPARATIVE EXAMPLE 4

A multilayer board was prepared by repeating the procedure of Example 1, except that neither chromate treatment layer nor silane coupling agent layer was formed, and the surface of the resistance layer was modified by an electrochemical treatment, which was conducted at an electrical current density of 5 A/dm$^2$ for 10 sec. by dipping the surface of the resistance layer in a 30 wt % potassium hydroxide solution whose temperature was 25° C., to form a thin layer containing oxides, hydroxide, etc., on the surface of the resistance layer.

The evaluations of the peel strength as well as the chemical resistance property of the resulting board were performed by the evaluation procedures as described in Example 1. The results are shown in Table 1.

TABLE 1

| | Chromate treatment layer | | Silane coupling agent | | Peel strength (kg/cm) | | | |
|---|---|---|---|---|---|---|---|---|
| | Composition of the solution and plating conditions | Cr content μg/dm$^2$ | Conc. wt % | Agent used | under the normal condition | after HCl treatment | after KCN treatment | after heat treatment |
| Example 1 | Na$_2$Cr$_2$O$_7$.2H$_2$O 3.5 g/l<br>pH 5.7<br>0.5 A/dm$^2$ 4 s 25° C. | 30 | 0.2 | 3-glycidoxypropyl-trimethoxysilane | 1.93 | 1.91 (1.0) | 1.88 (2.6) | 1.50 |
| Example 2 | CrO$_3$ 10 g/l<br>pH 1.08<br>1 A/dm$^2$ 10 s 25° C. | 95 | 0.5 | 3-glycidoxypropyl-trimethoxysilane | 2.10 | 2.07 (1.5) | 2.00 (3.4) | 1.51 |
| Example 3 | Na$_2$Cr$_2$O$_7$.2H$_2$O 0.5 g/l<br>pH 5.7<br>0.1 A/dm$^2$ 3 s 25° C. | 12 | 1.0 | 3-aminoproply-triethoxysilane | 1.90 | 1.88 (1.1) | 1.85 (2.7) | 1.49 |
| Example 4 | Na$_2$Cr$_2$O$_7$.2H$_2$O 5 g/l<br>pH 5.0<br>1 A/dm$^2$ 5 s 25° C. | 50 | 3.0 | 3-aminopropyl-triethoxysilane | 2.06 | 2.03 (1.5) | 1.99 (3.4) | 1.51 |
| Comparative example 1 | — | — | — | — | 0.73 | 0.70 (4.1) | 0.69 (5.5) | 0.82 |
| Comparative example 2 | Na$_2$Cr$_2$O$_7$.2H$_2$O 3.5 g/l<br>pH 5.7<br>0.5 A/dm$^2$ 4 s 25° C. | 30 | — | — | 1.30 | 1.28 (1.6) | 1.27 (2.4) | 1.49 |
| Comparative example 3 | — | — | 0.2 | 3-glycidoxyproplyl-trimethoxysilane | 1.10 | 1.0 (9.1) | 0.96 (12.8) | 0.99 |
| Comparative example 4 | 30 wt % KOH<br>5 A/dm$^2$ 10 s | | — | | 1.26 | 1.22 (3.2) | 1.13 (10.3) | 0.69 |

As apparent from the measuring results shown in Table 1, what is evident on comparing Examples 1 to 4 with Comparative Examples 1 to 4 is that the peel strength attained in Examples of the present invention have extremely high values.

In Comparative Example 1, on the copper foil formed was only a plated Ni-P layer, and in each of Comparative Examples 2 and 3, either a chromate treatment layer or a silane coupling agent layer was formed on a resistance layer, without forming both layers.

In Comparative Example 4, on a resistance layer formed was only an electrochemical treatment layer. None of the peel strength attained in these Comparative Examples satisfied sufficiently the degree of quality required in practical use.

What is claimed is:

1. An article of manufacture in the form of a multilayer material for a printed circuit board which comprises
   (a) a conductive layer consisting of an electrically highly conductive material,
   (b) a resistance layer formed on the conductive layer, the resistance layer consisting of an electrical resistance metal-containing material,
   (c) a chromate treatment layer formed on the resistance layer, the chromate treatment layer being formed on the resistance layer by subjecting the surface of the resistance layer to a chromate treatment and containing chromium in an amount of 5 to 120 $\mu$g per 1 $dm^2$ of the chromate treatment layer,
   (d) a silane coupling agent layer formed on the chromate treatment layer, the silane coupling agent layer being formed by applying a solution of a silane coupling agent to the surface of the chromate layer followed by drying, the concentration of the silane coupling agent in the solution to be applied being 0.001 to 5% by weight and the silane coupling agent being at least one of the compounds represented by the following general formula:

$YRSiX_3$ wherein
   Y is a functional group which has a reactivity toward a polymer,
   R is a combining group linking the group Y with the silane atom and containing an acyclic or cyclic hydrocarbon group, and
   X is an organic or inorganic hydrolyzable group bound to the silane atom.

2. The multilayer material as claimed in claim 1, wherein the conductive layer is a copper foil.

3. The multilayer material as claimed in claim 2, wherein the thickness of the resistance layer is in the range of 100 to 5,000 Å, and the thickness of the chromate treatment layer is in the range of 40 to 400 Å.

4. The multilayer material as claimed in claim 3, wherein the resistance layer is a Ni-P alloy layer plated on the surface of the conductive layer.

5. The multilayer material as claimed in claim 4, wherein the chromate treatment layer is formed by subjecting the surface of the resistance layer to a chromate treatment by using an aqueous solution of at least one water-soluble chromium compound selected from the group consisting of chromic anhydride, chromates, and dichromates.

6. The multilayer material as claimed in claim 5, wherein the chromate treatment layer is formed by subjecting the surface of the resistance layer to an electrolytic chromate treatment by using an aqueous solution of sodium dichromate dihydrate.

7. The multilayer material as claimed in claim 1, wherein the solution of a silane coupling agent is an aqueous solution of a silane coupling agent selected from the group consisting of 3-glycidoxypropyltrimethoxysilane and 3-aminopropyltriethoxysilane.

8. A multilayer board having a resistance layer for the manufacture of a printed circuit board, which multilayer board comprises a multilayer material as claimed in any one of claims 1 to 6 and 8 and an insulating support wherein the insulating support is adhering to the silane coupling agent layer of the multilayer material.

9. The multilayered material as claimed in claim 1, wherein the resistance layer is in the form of resistors selectively formed on the conductive layer.

10. The multilayered material as claimed in claim 1, wherein the silane coupling agent is at least one compound selected from the group consisting of
vinyltrimethoxysilane,
vinyltriethoxysilane,
vinyltris(2-methoxyethoxy)silane,
N-(2-aminoethyl)-3-aminopropylmethyldimethoxysilane,
N-(2-aminoethyl)-3-aminopropyltrimethoxysilane,
3-aminopropyltriethoxysilane,
3-glycidoxypropyltrimethoxysilane,
3-glycidoxypropylmethyldimethoxysilane,
2-(3,4-epoxycyclohexyl)ethyltrimethoxysilane,
3-chloropropylmethyldimethoxysilane,
3-chloropropyltrimethoxysilane,
3-methacryloxypropyltrimethoxysilane, and
3-mercaptopropyltrimethoxysilane.

* * * * *